Dec. 27, 1955 D. MACKEY ET AL 2,728,818

SIGNAL TRANSFER NETWORKS FOR MULTI-RANGE HIGH-FREQUENCY RADIO OR TELEVISION SYSTEMS

Filed June 30, 1950

INVENTORS
Donald Mackey
& Earl J. Sass
BY H. L. Weston
ATTORNEY 2,728,818
Patented Dec. 27, 1955

2,728,818

SIGNAL TRANSFER NETWORKS FOR MULTI-RANGE HIGH-FREQUENCY RADIO OR TELEVISION SYSTEMS

Donald Mackey, Haddon Heights, and Earl J. Sass, Oaklyn, N. J., assignors to Radio Corporation of America, a corporation of Delaware Application June 30, 1950, Serial No. 171,494
5 Claims. (Cl. 179—171)

This invention relates to signal transfer networks for high frequency electrical systems. In particular it relates to a signal transfer network for matching impedances between signal sources and input circuits of multi-range high-frequency radio or television systems.

In televisions receivers, and the like, where signal frequencies become high, the efficiency of transfer of signals from one circuit to another may seriously be reduced by stray inductance in the transfer path. Furthermore, stray inductance may cause detuning or high transfer impedance at the desired frequencies. Generally coils or inductors are subject to a certain amount of the leakage inductance which in combination with other stray wiring inductance may contribute to the above mentioned undesirable effects.

Likewise, stray capacitance may be objectionable in that it may provide undesirable signal paths. These paths may not only seriously reduce the signal intensity but they may also change the inductance to capacitance ratio of associated tuning circuits. Stray reactances in combination with other lumped circuit reactances may develop undesired resonance effects which either interfere with signal transfer or cause the generation of undesired frequencies. Circuit disturbances and noise voltages may develop in part in resonant circuits of this type. It is desirable in any case, to reduce interference from stray reactance.

With wide-range, high-frequency signal transfer networks, such as multi-range tuning systems presently used in television receivers, the wide frequency range covered in tuning through certain assigned television bands introduces further difficulties in the manner of maintaining good signal-to-noise ratios and a high gain therethrough. One contributing factor is the decreased input conductance of electronic tubes at high frequencies. This must be compensated for in wide range signal transfer networks to provide a proper impedance match over the entire frequency range. As is well known in the art, a proper impedance match is also necessary to provide the maximum energy transfer from one source or circuit to another.

It is therefore an object of this invention, to provide an improved signal transfer network for high frequency circuits which is substantially free of the foregoing and other problems common to the prior art.

It is also an object of the invention, to provide a signal transfer network for high-frequency, multi-range radio systems which affords high gain and optimum impedance matching over the entire frequency range.

It is a further object of the invention, to provide a signal transfer network for coupling high frequency signal circuits, having a good signal-to-noise ratio and a high frequency cut-off characteristic providing effective image and oscillator rejection over an extended frequency range.

It is still a further object of the invention to provide a signal conveying system having means for effectively utilizing stray reactance as part of a high gain signal transfer network.

In accordance with the invention there is provided an improved, impedance-matching, signal-transfer network. This network includes a variable adjustment arm, which preferably comprises an inductor variable in unison with band-switching or tuning means. One specific embodiment provides a series of inductors adapted for successive connection into the network upon selection of each frequency range. Each inductor is designed to provide optimum impedance matching in the network, for one of the frequency ranges in a multi-range or multi-band radio system. The invention further provides means for utilizing stray reactance in the signal transfer network to simplify the construction thereof. Other advantages and features, which will hereinafter be described in detail, are afforded by the invention.

The novel features which are considered to be characteristic of the invention are set forth with particularity in the appended claims. The organization and method of operation of the invention itself, however, is best understood from the following description, when read in connection with the accompanying drawing.

Figure 1:
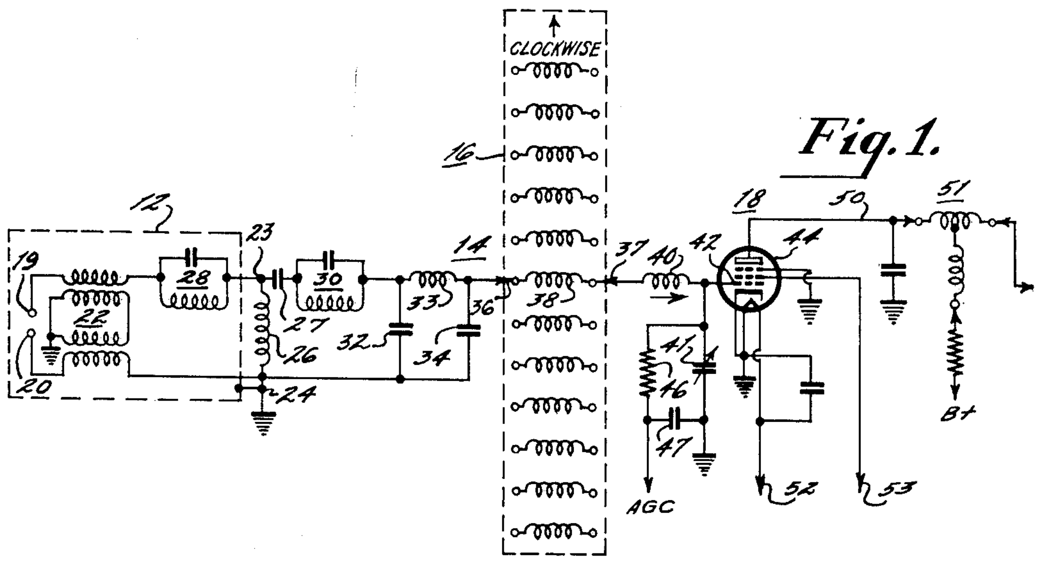
Figure 1 is a schematic circuit diagram of a high-frequency signal transfer network embodying the invention.

Referring to the drawing, like reference characters represent like component parts throughout the respective views. Referring to Figure 1 in particular, a signal transfer network is provided having a signal input impedance matching circuit portion 12. The signal transfer network further comprises an impedance matching signal transfer unit 14 and a radio frequency amplifier stage 18. A pair of input terminals 19 and 20 are provided for connecting a signal input source to an elevator transformer 22 in the input circuit portion 12. By means of the elevator transformer 22, the impedance of a balanced input transmission line may be matched into an unbalanced load at the output terminals 23 and 24 of the input circuit portion 12. Thereby, any conventional input circuit may be connected to the signal transfer unit 14. For example, a standard 300 ohm transmission line, such as is used for an antenna lead in cable, may be matched to a single end unbalanced input inductor 26.

A first parallel-resonant intermediate-frequency (I.-F.) trap circuit 28 is provided in the network and is coupled between one lead on the elevator transformer 22 and the high potential lead 23 of the input inductor 26. Another similar resonant intermediate frequency trap circuit 30 is interposed between the high potential lead 23 of the input inductor 26 and the impedance matching signal transfer unit 14.

The signal transfer unit 14 is coupled to the input inductor 26 by means of the second I.-F. trap and a series coupling capacitor 27. In effect, the signal transfer unit 14 comprises a double-pi ($\pi$) impedance matching section. A first pi of the double-pi section includes a series fixed inductor 33 and common coupling capacitor 34 shunting an input capacitor 32. The second pi includes the common coupling capacitor 34 of the double-pi section, and a filter leg connected in shunt therewith including a compensating inductor portion 38. This portion 38 is variable and as shown comprises one of a series of inductors 16 or other means for changing the inductance value of the compensating inductor 38. Each inductor corresponds to a different range in the system and is adapted for selective connection between terminals 36 and 37. Alternatively, the portion 38 may comprise a continuously variable inductor. A small variable inductor 40 is provided in the filter leg in series with the terminals 36 and 37 for initial adjustment. An adjustment capacitor 41 serially connected between the variable inductor 40 and ground completes the filter leg. The adjustable capacitor 41 together with the stray input capacity of the tube 44 in the amplifier stage 18 comprises the input reactance for the tube 44. A grid resistor 46 provides the direct current connection from the tube control electrode 42 to an automatic gain control (AGC) voltage source. Some other bias means for the amplifier tube 44 may be used if desired. The bias means is bypassed to ground for signal frequencies by a capacitor 47. The grid resistor 46 is proportioned to provide the primary load impedance for the signal transfer network thereby to obtain the desired frequency response and signal gain on the low frequency ranges. The input conductance of the tube acts in a similar manner to provide the primary load impedance at the higher frequency ranges.

The amplifier stage 18 is more or less conventional and has an output lead 50 connected to the plate of the pentode electronic tube 44. Leads 52, 53 are provided to the tube elements for connection to filament and screen grid voltages respectively. There is provided in the tube output circuit a multi-range selectable tuned circuit unit 51. Thereby a range selection switch may be interconnected for unicontrol selection of one of a series of circuit units with the corresponding one of the series of compensating inductors 16.

In operation, the series of compensating inductors 16 may be attached to and selected by a rotary type turret tuner, or the like, with which simultaneously successive tuned circuit units 51 are selected. Such tuners are currently used in television or like radio receivers. The values of the double-pi section inductances are then chosen so that impedance matching is effected between the input inductor 26 and the grid input circuit of the pentode tube 44. Then the compensating inductor 38 is changed in value by the turret to properly match impedances in each of the tuned frequency positions of the system.

Operation of the double-pi section may be more easily explained in connection with the simplified equivalent circuit of Figure 2. In this circuit, a generator 60 represents the source of the incoming signal energy as connected between terminals 19 and 20. Voltage and power losses in the generator and the signal transfer circuit are signified by those dissipated in the resistances 62 and 63 in series with the generator. Only the signals which reach the input capacitor 32 of the double-pi section are considered in the circuit analysis. Therefore the I.-F. trap circuits may be neglected in the equivalent circuit and any losses therein to signal frequencies may be included with those of the resistors 62 and 63. A single variable compensating inductor 39 is connected in the second leg of the signal transfer unit 14. This inductor includes the total inductance of the switch contacts, the wiring and the small variable inductor 40. Input capacity for the tube 44 and shunt wiring capacities are lumped in the fixed output capacity 43 which shunts the tube input resistance 45.

The inductance ratios of the inductors 33 and 39 may be adjusted by means of the variable compensating inductor 39. In this manner the coupling capacitor 34 in the center leg of the double-pi section may be effectively moved on either side of the electrical center of the section. That is, a portion of the capacitive reactance of the coupling capacitor 34 is selectively added in shunt with either the input capacity 32 or the output capacity 43 of the double-pi section in accordance with the inductance ratio. The proper values of input and output resistances for optimum impedance matching may be determined, or conversely the proper capacity values may be determined. Thus, the resistances are inversely proportional to the square of the effective values of the corresponding capacities. This relationship may be explained in mathematical terms for an impedance match between an input resistance R and an output resistance R′ by the relation $$\frac{C^2}{C'^2}=\frac{R'}{R}$$

wherein C is the effective input capacitance and C′ is the effective output capacitance of the double-pi section.

When the double-pi section inductances 33 and 39 are equal in value the coupling capacitor 34 is at the electrical center of the circuit. Conversely when the inductances are unequal, the effective position of the coupling capacitor 34 changes. Thus, by making the compensating inductor 38 of Fig. 1 larger, the coupling capacitance is effectively partially connected in shunt with the input capacitor 32. This will raise the capacitance ratio of the network. Accordingly the circuit is adjusted for the lower frequency ranges since the resistance ratio is inversely proportional to the capacitance ratio. That is, the output resistance which is in effect the tube input conductance is smaller at higher frequencies. Therefore, assuming other variables constant, the matching of an input signal circuit to the input impedance of the tube at higher frequencies is accomplished in this manner. Likewise a smaller compensating inductor will afford a matching ratio for a higher tube input conductance at lower frequencies. In practice, however, all the variables change with frequency. Therefore, the value of the compensating inductance must be chosen in order to provide the proper impedance matching ratio for the particular conditions encountered. Means for calculating and choosing such values are well known in the art, so need not be herein more fully explained.

Figures 2, 3, 4, 5, 6:
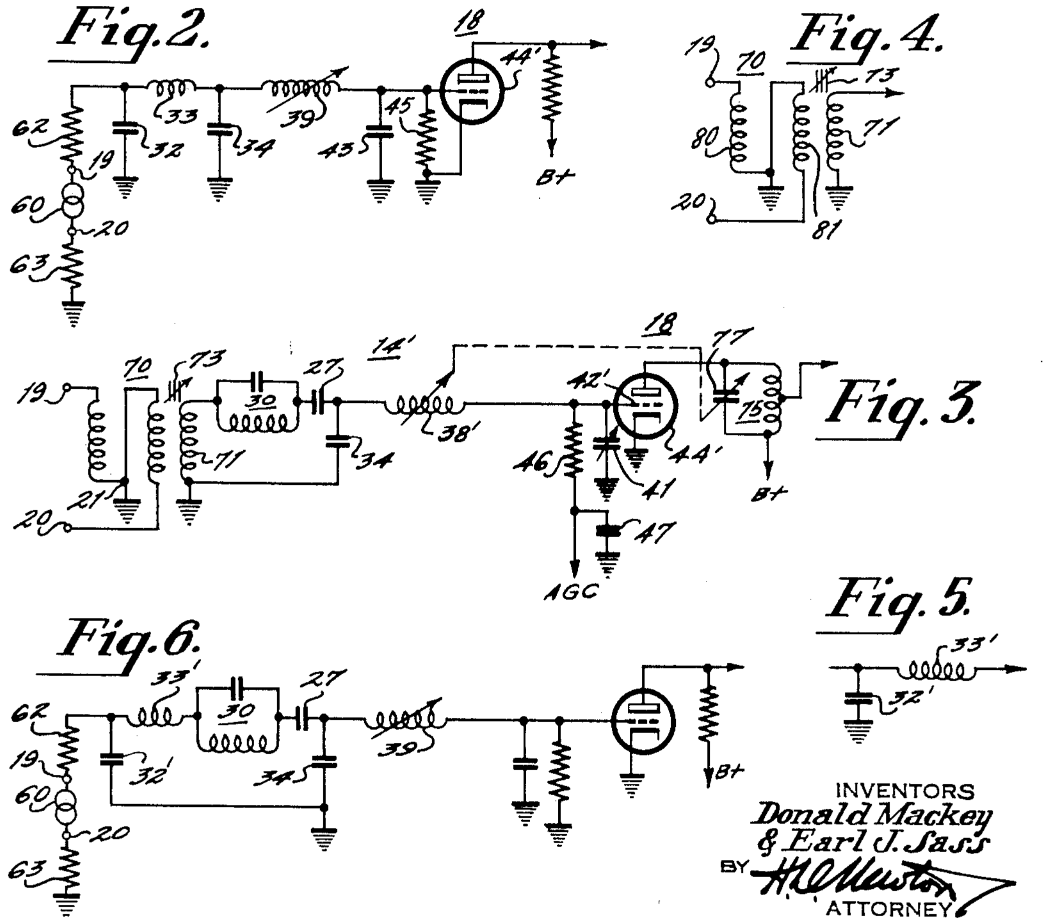
Figure 2 is an equivalent circuit schematic diagram of the network in Figure 1, at signal frequencies.
Figure 3 is a schematic circuit diagram of a modified signal transfer network embodying the invention.
Figure 4 is a schematic circuit diagram of an input impedance matching transformer embodying certain features of the invention.
Figure 5 is an equivalent schematic circuit diagram of the leakage and distributed reactances of the transformer in Figure 4 at signal frequencies; and, Figure 6 is an equivalent schematic diagram of the circuit shown in Figure 3, at signal frequencies.

A modified signal transfer network, of the same general class but having specific and improved features, is shown in Figure 3. This arrangement provides for a more cheaply manufactured transfer network having improved functional advantages. A circuit is provided and connected in such a manner that stray reactances may entirely replace some of the network component parts. This feature simplifies the network by eliminating component parts, and their resulting high frequency losses. Furthermore stray reactances which heretofore were objectionable are used to obtain the proper operational characteristics.

Input terminals 19 and 20 are provided for connecting a signal input source to the primary of a broad band transformer 70. The primary comprises a bifilar winding having a center tap 21 which is preferably grounded. The input terminals 19 and 20 therefore may be used for connection to a balanced signal input line, or the like, such as a conventional television antenna lead in line. The secondary winding 71 of the transformer 70 is coupled by a modified signal transfer unit 14′ to the control electrode 42′ of a triode amplifier tube 44′ or other electron device in a tuned radio frequency stage 18. The transformer secondary winding 71 therefore provides an unbalanced input impedance for the signal transfer unit 14′. The signal transfer unit 14′ is then used to provide proper impedance matching between the transformer 70 and the tube input circuit at all frequencies within the variable frequency range of the R.-F. amplifier stage 18.

A high permeability core 73 is provided in the transformer 70. This core functions to modify or reduce the inherent leakage inductance of the transformer 70 such that it may attain a value representing an inductance similar to that needed in the first leg of the double-pi section. The core may be variable if desired to adjust for differences in circuit lead inductances and the like. In addition, the wiring capacity between the turns of the transformer as reflected into the secondary winding 71 serves with other stray capacities of the circuit as the input capacity of the signal transfer unit. Between the secondary winding 71 and the coupling capacity 34 of the double-pi section is connected an I.-F. rejection filter or trap circuit 30 and a D.-C. blocking capacitor 27. The capacitor 27 serves to isolate the direct current circuit of the grid 42' from ground.

A variable frequency circuit 75 is shown connected in the plate circuit of the amplifier tube 44'. The circuit 75 may be any of the many known variable frequency tunable circuits, and in this embodiment is shown is shown tuned by a variable capacitor 77 which is interconnected for unicontrol operation with the variable compensating inductor 38' in the signal transfer unit 14'. With such an arrangement the impedance matching ratio may be smoothly varied in such a manner that proper impedance matching is obtained at all points along the tuning range. The output capacitor 41 of the signal transfer unit comprises the major portion of the grid input reactance of the tube 44' for high frequencies since the capacitor 41 represents a smaller impedance at high frequencies than the grid resistor 46. It therefore serves both as the double-pi section output impedance and as a large portion of the amplifier tube input impedance at higher frequencies.

Specific features of the transformer 70 are described in connection with Figure 4. For example, the primary winding is adapted for connection with a balanced input source. It therefore comprises a bifilar winding having a center tap. Two portions 80 and 81 each having an equal number of turns are connected respectively to ground from the terminals 19 and 20. These two sections are preferably wound concentrically with the secondary winding 71 upon a single coil form. When the transformer input and output impedances are equal, the number of turns in the secondary winding 71 is made equal to the total number of primary turns. Since the windings are concentric, the core 73 may be of powdered iron or the like and may be adjustably inserted within the transformer coil form. Such means for reducing the amount of leakage inductance in the transformer is in general necessary and will be described more fully hereinafter.

An equivalent circuit of the transformer 70 at signal frequencies is shown in Figure 5. The capacitor 32' corresponds to the double-pi section input capacity. It represents both the capacity between transformer windings as referred to the secondary winding and other stray capacities. Likewise the inductance 33' corresponds to the fixed inductance in the first leg of the double-pi section. When the transformer is connected, as shown in Figure 3, this inductance 33' is the leakage inductance as referred to the secondary winding 71. The leakage reactances are, when used in this manner, not objectionable. Rather they contribute to the functional operation of the network and take the place of otherwise necessary circuit components.

Figure 6, being the signal frequency equivalent circuit of the impedance transfer network of Figure 3, is in most respects similar to that of Figure 2. The I.-F. trap circuit 30 and the D.-C. blocking capacitor 27 are shown in this circuit. They may however be considered a portion of the fixed inductor 33 of the first leg of the double-pi section since a high pass filter will look like an inductance to the lower signal frequencies. Therefore the simplified circuit of Figure 3 is identical in operation with the more complicated circuit of Figure 1.

It is therefore readily seen that the design of the input transformer to utilize the stray reactances permits the use of a simpler and less expensive circuit without any sacrifice of functional operation. In addition, the stray reactances of the transformer or of an electrical circuit associated with the signal transfer unit are embodied in a tuned circuit so that they do not contribute to undesired resonances.

There is therefore provided in accordance with the invention, a signal transfer network for radio systems operable with improved frequency response and signal transfer characteristics throughout an extended frequency range. The network may provide optimum impedance matching through all the bands in a multi-range television or other type of radio system. The means for effecting variable impedance matching preferably comprises an adjustable inductive portion in a double-pi impedance matching section. Such a double-pi section in combination with the signal transfer network provides the foregoing and other operational advantages and functions.

Having thus described the nature and manner of operation of the invention in detail, the features which are considered patentable are contained in the appended claims.

What is claimed is:

1. A signal transfer network for a multi-range high-frequency radio system tunable throughout an extended frequency range comprising in combination, an antenna matching transformer, a high frequency amplifier stage, and an impedance matching signal transfer unit coupled between said transformer and said amplifier stage comprising an input capacitor connected to said transformer, a fixed inductor and coupling capacitor connected in series and across said input capacitor, a series compensating inductor and output capacitor connected across said coupling capacitor, means connecting said amplifier stage to said output capacitor, means for tuning said amplifier stage and means for changing the inductance value of said compensating inductor relative to the inductance value of said fixed inductor in unison with the tuning of said amplifier stage to effectively shift different portions of the impedance of the coupling capacitor selectively in shunt with the input and the output capacitors, whereby effective impedance matching is attained between said transformer and said amplifier stage throughout said extended frequency range.

2. A network as defined in claim 1 wherein said transformer is provided with means for modifying the amount of inherent leakage inductance, and wherein said leakage inductance and shunt capacities of said transformer comprise said input capacitor and said fixed inductor.

3. A network as defined in claim 1 wherein said compensating inductance comprises a series of distinct inductors corresponding to different portions of said frequency range and adapted for selective successive connection in said signal transfer unit, and wherein said means for changing the inductance value selectively connects said series of inductors succesively in said impedance matching unit.

4. A signal transfer network for television receivers of the type which are tunable over a wide frequency range to receive any one of a plurality of television channels comprising in combination, an antenna input circuit for said television receiver, a high frequency amplifier circuit, means connecting an impedance matching signal transfer circuit between said antenna input circuit and said amplifier comprising an input capacitance effectively connected with said antenna input circuit, a fixed inductor and coupling capacitor connected in series and across said input capacitance, a series compensating inductor and output capacitance connected across said coupling capacitor, means connecting said amplifier circuit to said output capacitance, means for tuning said amplifier circuit and means for changing the inductance value of said compensating inductor relative to the inductance value of said fixed inductor in unison with the tuning of said amplifier stage to effectively shift different portions of the impedance of the coupling capacitor selectively in shunt with the input and output capacitances whereby effective impedance matching is obtained between said antenna input circuit and the amplifier stage throughout said extended frequency range.

5. A signal transfer network for television receivers of the type having a turret tuner with individual circuit strips positioned for selective connection with said receiver to tune the receiver to any one of a plurality of television channel frequencies comprising in combination, an antenna input circuit for said television receiver, a high frequency amplifier circuit, means connecting an impedance matching signal transfer circuit between said antenna input circuit and said amplifier circuit comprising an input capacitance effectively connected with said antenna input circuit, a fixed inductor and coupling capacitor connected in series and across said input capacitance, an output capacitance, a plurality of different compensating inductors located on different ones of said circuit strips, one of said compensating inductors and said output capacitance being connected across said coupling capacitor, means connecting said amplifier circuit to said output capacitance, means for selectively connecting different ones of said circuit strips with said television receiver for changing the inductance value of said compensating inductor relative to that of said fixed inductor in unison with the tuning of said amplifier stage to effectively shift different portions of the impedance of the coupling capacitor selectively in shunt with the input and output capacitances to attain effective impedance matching between the antenna input circuit and the amplifier stage over the frequency band of said television channels.

References Cited in the file of this patent

UNITED STATES PATENTS

| | | |
|---|---|---|
| 1,759,332 | Whittle et al. | May 20, 1930 |
| 2,194,180 | Sabloniere | Mar. 19, 1940 |
| 2,310,323 | Sharp | Feb. 9, 1943 |
| 2,360,475 | Chatterjea et al. | Oct. 17, 1944 |
| 2,423,152 | Mitchell | July 1, 1947 |
| 2,456,800 | Taylor et al. | Dec. 21, 1948 |
| 2,533,030 | Melman | Dec. 5, 1950 |
| 2,611,030 | Sontheimer | Sept. 16, 1952 |
| 2,615,983 | Bussard | Oct. 28, 1952 |

FOREIGN PATENTS

| | | |
|---|---|---|
| 309,273 | Germany | Feb. 2, 1921 |